United States Patent
Edwards et al.

(10) Patent No.: US 10,101,395 B2
(45) Date of Patent: Oct. 16, 2018

(54) WETTING CURRENT DIAGNOSTICS

(71) Applicants: William E. Edwards, Ann Arbor, MI (US); Randall C. Gray, Tempe, AZ (US); Anthony F. Andresen, Chandler, AZ (US)

(72) Inventors: William E. Edwards, Ann Arbor, MI (US); Randall C. Gray, Tempe, AZ (US); Anthony F. Andresen, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 663 days.

(21) Appl. No.: 14/624,778

(22) Filed: Feb. 18, 2015

(65) Prior Publication Data
US 2016/0238658 A1    Aug. 18, 2016

(51) Int. Cl.
| | |
|---|---|
| *G01R 31/327* | (2006.01) |
| *G01R 19/165* | (2006.01) |
| *G01R 31/02* | (2006.01) |
| *H03K 17/18* | (2006.01) |

(52) U.S. Cl.
CPC ... *G01R 31/3278* (2013.01); *G01R 19/16571* (2013.01); *G01R 31/025* (2013.01); *G01R 31/3277* (2013.01); *H03K 17/18* (2013.01); *H03K 2217/0027* (2013.01)

(58) Field of Classification Search
CPC .............. G01R 31/327; G01R 31/3278; G01R 31/3277; B60L 3/0046; B60L 3/04
USPC ........................................................ 324/418
See application file for complete search history.

(56) References Cited

U.S. PATENT DOCUMENTS

| | | | |
|---|---|---|---|
| 4,977,478 A | 12/1990 | Powell | |
| 5,170,970 A | 12/1992 | Ballinger | |
| 5,621,250 A * | 4/1997 | Kim | B60L 1/00 307/10.1 |
| 5,671,131 A | 9/1997 | Brown | |
| 5,714,852 A | 2/1998 | Enderich | |
| 6,246,748 B1 * | 6/2001 | Yano | H04M 3/2272 379/2 |
| 6,377,051 B1 * | 4/2002 | Tyner | G01R 31/3278 324/415 |

(Continued)

OTHER PUBLICATIONS

"24-Channel Automotive Switch Monitor", Maxim Integrated Products, 2009, pp. 1-14.

(Continued)

*Primary Examiner* — Christopher McAndrew (57) ABSTRACT

A circuit for diagnostic testing includes a current source coupled to a power source and configured to provide wetting current along a path to a load control switch, a current sensor connected in series with the current source along the path, the current sensor being configured to generate a current sensor signal indicative of a current level along the path, a voltage measurement unit having an input terminal coupled to a node along the path through which the wetting current flows to reach the load control switch, the voltage measurement unit being configured to detect a state of the load control switch based on a voltage at the node, and a controller coupled to the current sensor and the voltage measurement unit, the controller being configured to determine a wetting current diagnostic condition in accordance with the current level and the detected state.

17 Claims, 4 Drawing Sheets

(56) References Cited

U.S. PATENT DOCUMENTS

| | | |
|---|---|---|
| 6,600,242 B1 | 7/2003 | Dennison |
| 6,800,965 B1 | 10/2004 | Turner et al. |
| 7,497,785 B2 | 3/2009 | Koncelik, Jr. |
| 7,570,004 B2 * | 8/2009 | Tracht ................ G01R 31/025 318/299 |
| 8,008,970 B1 | 8/2011 | Homol et al. |
| 8,120,502 B2 | 2/2012 | Usukura et al. |
| 8,143,749 B2 | 3/2012 | Gagne |
| 8,275,094 B2 | 9/2012 | Li |
| 8,570,147 B2 | 10/2013 | Girard, III et al. |
| 8,908,752 B2 * | 12/2014 | Zojer ................ H04M 3/305 375/224 |
| 2007/0217101 A1 * | 9/2007 | Carter ................ H04M 19/08 361/54 |
| 2008/0205631 A1 * | 8/2008 | Francheschini ...... H04M 11/062 379/377 |
| 2011/0235372 A1 * | 9/2011 | Mohr ................ G01R 19/0092 363/39 |
| 2012/0035801 A1 * | 2/2012 | Browne ................ B62D 5/0487 701/29.1 |
| 2012/0063499 A1 * | 3/2012 | Zojer ................ H04M 3/305 375/224 |
| 2013/0278269 A1 * | 10/2013 | Steck ................ G01R 31/3278 324/418 |
| 2015/0028877 A1 * | 1/2015 | McCormick ......... H01H 47/002 324/418 |

OTHER PUBLICATIONS

"A Diagnostic to Validate Wetting Current and Measure Switch Contact Resistance Degradation", An IP.com Prior Art Database Technical Disclosure, Apr. 25, 2014, 5 pages.

"Multiple Switch Detection Interface with Suppressed Wake-Up", Freescale Semiconductor, Inc., Mar. 2012, pp. 1-32.

* cited by examiner

WETTING CURRENT DIAGNOSTICS

FIELD OF INVENTION

The present embodiments relate to sensed switching.

BACKGROUND

Sensed switches are often used to control the operation of loads instead of powered switches. Powered switches are disposed serially with a load to directly control current delivered to the load. In contrast, sensed switches control the load current indirectly. The state of the switch is instead sensed with a low current signal. The opportunity to use a low current voltage measurement leads to reduced wiring harness complexity, weight, and costs. In complex electrical systems with numerous switch-controlled loads, such as automobile vehicles, the cost savings may be considerable.

Determining the state of a sensed switch typically involves a voltage comparison. For example, a voltage level dictated by the state of the switch is compared with a threshold voltage. The voltage level is ideally not dependent on the voltage drop across the switch contacts. But unfortunately, the switch contacts oxidize over time due to humidity and contamination, increasing the resistance presented by the switch itself. The increased resistance results in an increased sensed voltage, thereby increasing the risk of incorrect operation. Switch contact oxidation may be especially challenging in connection with normally open switches, i.e., switches with contacts that close upon application of an external force.

The oxidation challenge presented by sensed switches is not applicable to the powered switch approach. In powered switches, the current levels are high enough to burn off any oxidation of the switch contacts. Because the current levels may be much lower with sensed switches, a wetting current is used to remove the oxidation from the switch contacts. The wetting current is typically a temporary current level of the current that flows through the switch contacts when the switch transitions from open to closed. The temporary current level is sufficient to remove the oxidation. A circuit used to detect the state of the switch may also be configured to control the application of the wetting current.

Unfortunately, over time, faults may develop along the current path to the switch. For example, a fault may arise in the wiring harness between the control circuit and the switch. Some faults may inhibit the delivery of the wetting current to the switch.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of methods, circuits, and other devices or units for wetting current diagnostic testing are described. The diagnostic testing may be directed to determining or confirming that a wetting current for a load control switch flows when the load control switch is closed. The method may be implemented by a circuit or other unit or device directed to sensing the state of the switch. The wetting current diagnostic testing circuitry may be integrated with circuitry configured to detect the state of the load control switch and/or provide the wetting current. The devices, units, or circuits described herein may thus provide the capability for built-in self testing.

The diagnostic testing may be correlated with the state of the load control switch (e.g., open or closed). The correlation may involve detecting the state of the load control switch and/or the condition when wetting current is flowing. The diagnostic testing may be configured such that the wetting current may be detected when (e.g., only when) the load control switch is closed. In these and other ways, the testing may distinguish between wetting current and other current flows. Additional aspects of the diagnostic testing may involve other examples of coordinated voltage and current measurements. Through such coordination, diagnostic testing may be implemented when the load control switch is open. Such testing may include, for example, diagnosing the operation of a voltage measurement unit and/or diagnosing a leakage current fault condition and/or one or more other open switch fault conditions.

The disclosed embodiments may have a circuit topology that senses current along the current path to the load control switch. A variety of different current sensors may be used. The sensed current may be measured against multiple current thresholds.

The diagnostic testing may be directed to detecting, and differentiating between, several different fault conditions. Exemplary fault conditions include high and low wetting current faults, a switch detection fault, a leakage fault, and a system (e.g., voltage) offset fault. The fault conditions may involve both current and voltage measurements. Additional, alternative or fewer fault conditions may be tested. For example, in some cases, the presence of a leak is not tested.

Figure 1:
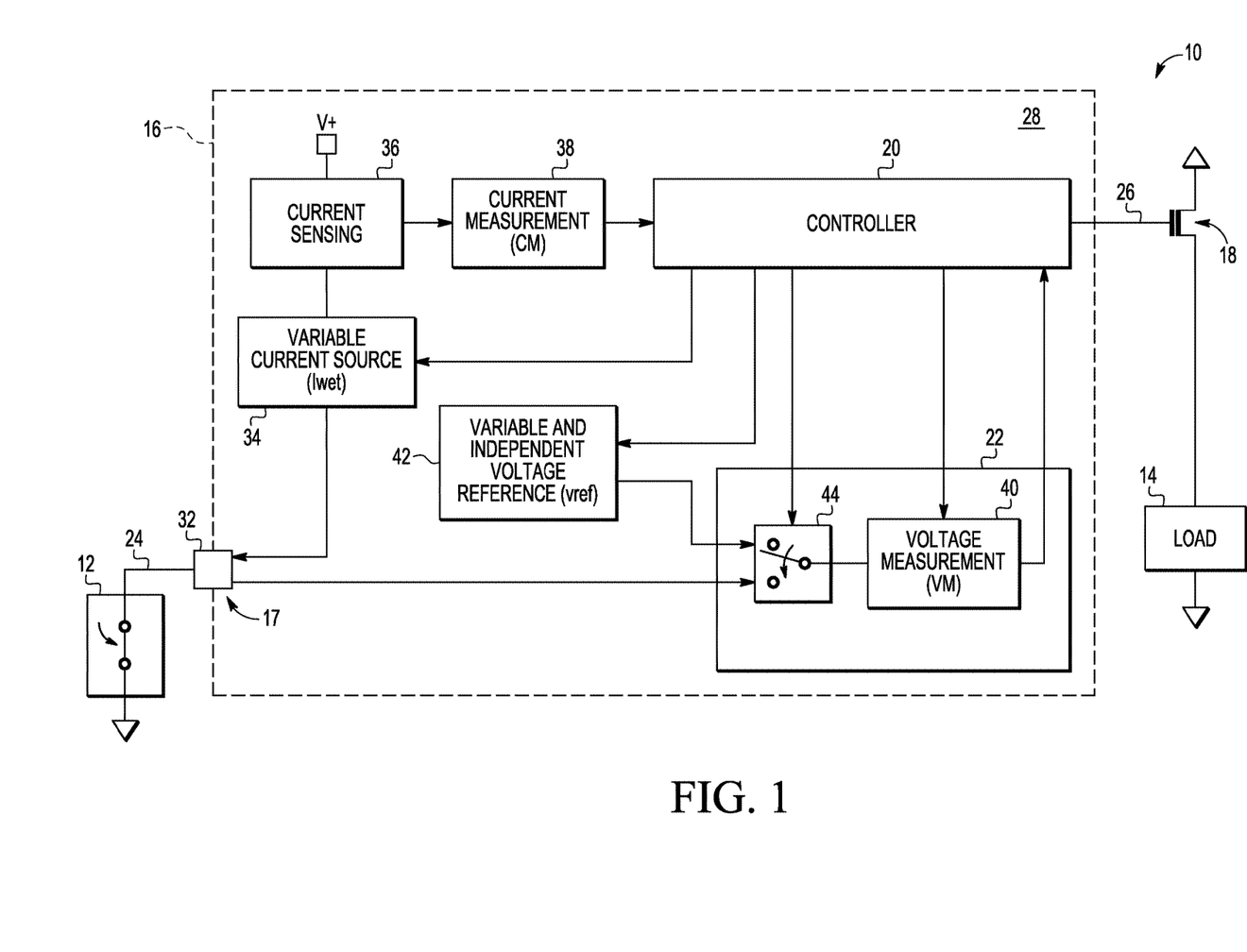
FIG. 1 is a schematic circuit diagram of an exemplary circuit configured to provide wetting current diagnostics for an external load control switch in accordance with one embodiment.

FIG. 1 depicts an electrical system 10 in which a load control switch 12 is provided to control the operation of a load 14. The load 14 may be a motor, lamp, or any other type of load. The load 14 may be configured for direct current (DC) or alternating current (AC) operation. In this embodiment, the load 14 is powered by a DC power source V+ that also provides power for the load control switch 12. In other cases, different voltage sources are used. For example, the power source for the load 14 may be a high voltage AC power source, and the power source for the load control switch 12 may be a low voltage DC power source, which may or may not be derived from or otherwise related to the high voltage AC power source.

In some cases, the electrical system 10 is a vehicular electrical system. The DC power source V+ may be a 12 Volt vehicular battery. In these and other cases, the load 14 is one of a number of loads controlled by respective load control switches 12. The nature and characteristics of the electrical system 10 may vary considerably.

The load control switch 12 is a sensed switch. The state of the load control switch 12 determines whether power is delivered to the load 14. As a sensed switch, the load control switch 12 is not disposed in the current path of the power delivered to the load 14. In some cases, the load control switch 12 is a push-button switch or other normally open load control switch. For example, in vehicular embodiments, the load control switch 12 may be a push-button switch, such as a power window push-button switch, directly actuated by an operator or other occupant of the vehicle. The load control switch 12 may be actuated in a variety of other ways. For example, the load control switch 12 may be actuated through the opening of a vehicle door or other indirect actuation mechanism.

In the embodiment of FIG. 1, the load control switch 12 is configured as a switch to ground. As a switch to ground, the closure of the load control switch 12 establishes a connection to ground. The connection to ground lowers a voltage level, which is sensed to control the delivery of power to the load 14. In other embodiments, the load control switch 12 is configured as a switch to battery or other voltage source. The load control switch 12 may be configured to establish a connection to any reference voltage.

A control module, unit, or circuit 16 senses the connection to ground (or other voltage change) at an evaluation node 17 of the control circuit 16. The load control switch 12 is coupled to the node 17. During operation, a wetting current $I_{wet}$ for the load control switch 12 flows through the node 17 when the load control switch 12 is closed. In the switch to ground example of FIG. 1, the connection to ground lowers the voltage level at the node 17. The control unit 16 is configured to detect the lowered voltage level at the node 17 and, thus, the state of the load control switch 12.

The control circuit 16 controls the delivery of power to the load 14 in accordance with the state of the load control switch 12. The control circuit 16 may thus be referred to or configured as a switch detection unit. In the switch to ground example of FIG. 1, the control circuit 16 allows power to reach the load 14 upon detecting the lowered voltage level at the node 17. To this end, the control circuit 16 includes a power transistor 18 that acts as a switch to allow current to flow through the load 14.

Activation of the power transistor 18 is controlled by a logic controller 20 (or other controller) and a detection circuit 22 of the control circuit 16. The logic controller 20 activates and deactivates the power transistor during a non-diagnostic mode of operation in response to a control signal provided by the detection circuit 22. In the example of FIG. 1, the logic controller 20 also controls operation of the detection circuit 22 and other components of the control circuit 16 during a diagnostic mode of operation. For example, the functioning of the control circuit 16 may be dictated by the state of the load control switch 12 in both non-diagnostic and diagnostic modes of operation.

The power transistor 18 is disposed in the current path of the load 14 rather than the load control switch 12. In this example, the power transistor 18 is a discrete power field effect transistor (FET) device. In other examples, the power FET device is part of an integrated circuit. Other types of transistor devices may be used, such as bipolar junction transistor devices. Other types of switches may be used, including relays.

The control circuit 16 may be one of several circuits in the electrical system 10. Multiple loads 14 may be controlled by each control circuit 16. Some of the components of the control circuit 16 may be replicated, with a respective instance of the component being provided for each load 14. For example, the control circuit 16 may include multiple power transistors 18, one for each load 14. Alternatively, a single control circuit 16 may control multiple loads 14.

In the example of FIG. 1, the logic controller 20, the detection circuit 22, and other components of the control circuit 16 are disposed on a single integrated circuit (IC) chip 28. In other cases, multiple IC chips may be used. For example, the logic controller 20 and the detection circuit 22 may be disposed on respective IC chips. The logic controller 20, the detection circuit 22, the FET device 18, and any other components of the control unit 16 may be mounted on a common circuit board, and/or disposed in a common housing, and/or otherwise integrated in any other manner or to any other desired extent. The load control switch 12 and the load 14 may be external to the board or housing of the control unit 16, or be otherwise disposed remotely from the control unit 16. Wiring 24, 26 may be used to establish connections between the control unit 16 and the load control switch 12 and the load 14, respectively. For example, a wiring harness may be used to carry the wiring 24, 26 from a door, dashboard, or other panel or portion of a vehicular interior, to another location in the vehicle at which the control unit 16 is located, such as an electronics cabinet under the dashboard. The manner in which the load control switch 12 and the load 14 are connected to the control unit 16 may vary. For example, components in addition to the wiring harness may be used, including, for instance, fuses.

The length of the wiring 24 may be sufficiently extensive to present significant parasitic capacitance and resistance. In some cases, one or more external capacitors and/or one or more external resistors are disposed in series with the wiring 24. For example, a series resistor may be included for purposes of electrostatic discharge (ESD) protection.

The wiring 24 couples the load control switch 12 to a pin 32 of the control circuit 16. The pin 32 may be one of a set of pins of the IC chip in which the control circuit 16 is integrated. The packaging of the control circuit 16 and the components thereof may vary. The nature of the pin 32 may thus be configured as a post, solder bump, or other connection point of the packaging of the detection circuit 22. In the embodiment of FIG. 1, the pin 32 corresponds with the node 17. The pin 32 and the node 17 may thus be disposed at the same voltage level. In other cases, the node 17 and the pin 32 may not constitute a common node. For example, a series resistor may be disposed between the node 17 and the pin 32.

The logic controller 20 may be configured to implement a number of logic functions. The functions include controlling the power transistor 18. To that end, a control signal may be generated by the control circuit 20 and provided to a gate or other control terminal of the power transistor 18. The functions also include analysis of the state of the load control switch 12. The state of the load control switch 12 is used to determine whether to generate or change the control signal to the power transistor 18. The logic controller 20 and the detection circuit 22 are also responsive to the state of the load control switch 12 to provide the wetting current.

The logic controller 20 performs functions directed to wetting current diagnostics. The logic controller 20 may implement one or more diagnostic routines of the wetting current function as described below. Each function or routine may be implemented by a separate logic block, software or firmware module, or other component of the logic controller 20. The logic blocks or other components of the logic controller 20 directed to implementing these functions may be integrated to any desired extent. For example, a single routine may be implemented by the logic controller 20 to provide all of the functions.

The control circuit 16 includes a current source 34 coupled to a power source V+. The current source 34 is configured to provide the wetting current along a path to the load control switch 12. The current source 34 may be a variable current source to provide different levels of current to the load control switch 12, including, for instance, wetting and sustaining current levels. Any number of current levels may be supported. The current source 34 may be or include an active circuit, such as current amplifier or other active current source circuit. In other cases, the current source 34 may be or include a passive circuit, such as a resistor or resistor network.

The control circuit 16 includes a current sensor 36 connected in series with the current source 34 along the path to the load control switch 12. The current sensor 36 generates a signal (e.g., a voltage signal) indicative of the current flowing along the path to the load control switch 12. In this example, the current sensor 36 is disposed between the current source 34 and the power source V+. In other cases, the current sensor 36 is disposed between the current source 34 and the pin 32. The relative positions of the current source 34 and the current sensor 36 along the path may thus vary from the example shown.

Figure 2:
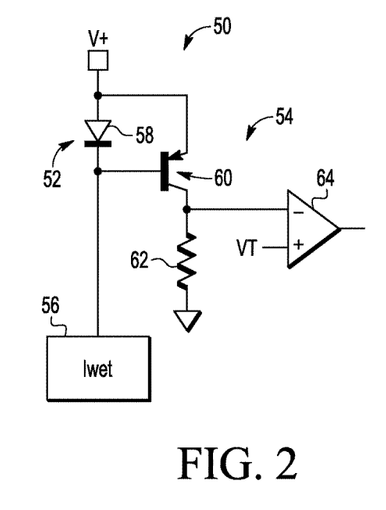
FIGS. 2-4 are schematic circuit diagrams of exemplary current sensor and measurement units of the circuit of FIG. 1 in accordance with various embodiments.
Figure 3:
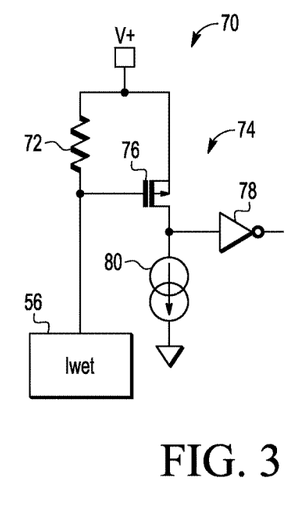
Figure 4:
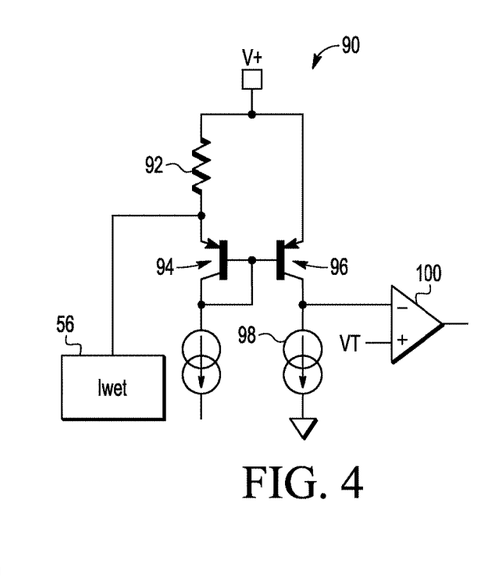

The current sensor 36 may include an active circuit, examples of which are provided in connection with FIGS. 2-4. In the example of FIG. 1, the logic controller 20 provides a current control signal to the current source 34 to establish the current level. Alternatively or additionally, the current sensor 36 may be or include a passive circuit, such as a resistor. The voltage generated across the resistor is indicative of the current flowing along the path to the load control switch 12. In some cases, the same resistor(s) may serve as both the current source 34 and the current sensor 36.

In the embodiment of FIG. 1, the control circuit 16 also includes a current measurement unit 38 coupled to the current sensor 36 to receive the current sensor signal. The current measurement unit 38 compares the current level indicated by the current sensor signal with one or more threshold current levels. The current measurement unit 38 is configured to generate one or more output signals indicative of the comparison(s). The output signal(s) may be provided to the logic controller 20. The current measurement unit 38 may be integrated with the current sensor 36 and/or the logic controller 20 to any desired extent. For example, the logic controller 20 may include a comparator, analog-to-digital convertor, and/or other circuitry to perform the comparison(s). Examples of current measurement units 38 are shown and described in connection with FIGS. 2-4.

The detection circuit 22 includes a voltage measurement unit 40 to detect the closure of the load control switch 12. The voltage measurement unit 40 has an input terminal coupled to the node 17 (e.g., the pin 32). The voltage measurement unit 40 is configured to detect a state of the load control switch 12 based on a voltage at the node 17. An output signal indicative of the state of the load control switch 12 (and/or the measured voltage) is provided by the voltage measurement unit 40 to the logic controller 20.

Figure 5:
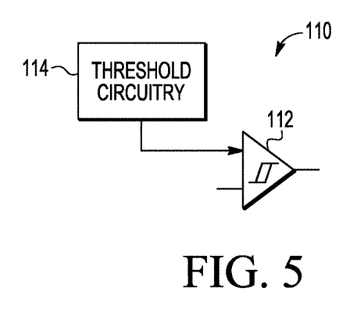
FIG. 5 is a schematic circuit diagram of an exemplary voltage measurement unit of the circuit of FIG. 1 in accordance with one embodiment.

The voltage at the node 17 may be compared to a reference voltage level. In some cases, a source of the reference voltage is coupled to another input terminal of the voltage measurement unit 40. In such cases, the voltage measurement unit may include a comparator, as shown in the example of FIG. 5. Alternatively, the reference voltage may be compared to an internal or inherent reference voltage level. For example, the voltage measurement unit 40 may include an analog-to-digital converter.

The logic controller 20 is coupled to the current sensor 36 and the current measurement unit 38 to receive a signal indicative of the current level along the wetting current path. The logic controller 20 is configured to determine a wetting current diagnostic condition in accordance with the current level. The wetting current diagnostic condition may be determined relative to one or more threshold current levels. For example, a desired range for the wetting current may be specified via two threshold current levels. The logic controller 20 may then provide a low current fault alert if the current level falls below the current range, and provide a high current fault alert if the current level is above the range. Alternatively, the current range may be specified by a single threshold current level along with an acceptable amount of deviation above and below the threshold current level, such as plus or minus 1 milliamp.

The logic controller 20 is also coupled to the voltage measurement unit 40 to provide the wetting current diagnostics in accordance with the detected state. The wetting current diagnostic condition may thus be based on both the output signal from the voltage measurement unit 40 as well as the output generated by the current sensor 36. For example, the logic controller 20 may be configured to implement one or more diagnostic routines (a first set) when the voltage measurement unit 40 detects that the state of the load control switch 12 is open, and then one or more diagnostic routines (a second set) when the state of the load control switch 12 is closed. As described below, the first set may be configured to confirm a low current level with an open switch, and to determine whether the state of the load control switch is detected correctly. The second set may be configured to compare the current level with the threshold current level(s).

The correlation between the voltage and current measurements may be based on the following assumptions, or desired or expected operational characteristics. Little to no current is expected when the load control switch 12 is open (i.e., open switch testing in the first set). For example, any current level below about 50 microAmperes for a 12 Volt automotive system may be considered acceptable. A desired level of wetting current is expected when the load control switch 12 is closed (i.e., closed switch testing in the second set). The diagnostic routines may be configured to implement the open switch testing first, e.g., as a preliminary matter to confirm that the switch state is being detected properly.

Figure 6:
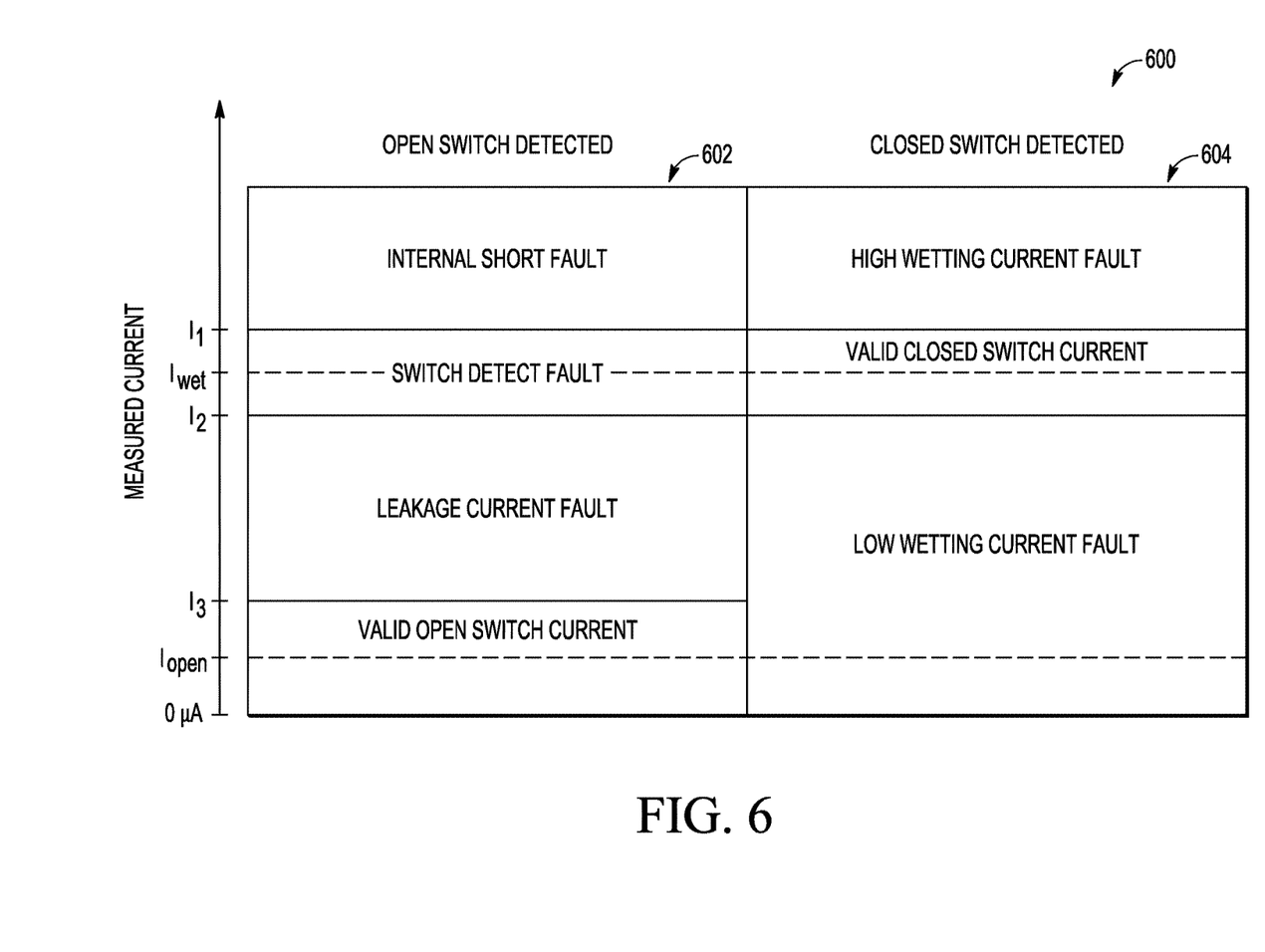
FIG. 6 is a graphical representation of exemplary current level ranges associated with a number of valid and fault operating conditions in accordance with one embodiment.

FIG. 6 is a chart 600 depicting one example of how the logic controller 20 correlates operation of the voltage measurement unit 40 and the current measurement unit 38. Details regarding the open switch testing in the first set is shown in a column 602. Details regarding the closed switch testing in the second set is shown in a column 604. Various fault conditions may be identified in each set based on the measured current level.

The diagnostic routine(s) in the open switch testing may proceed as follows. While receiving an indication of an open state of the load control switch 12, the logic controller 20 may provide a switch detection fault if the current level falls between a current threshold $I_1$ and a current threshold $I_2$. Measured current levels between the current thresholds $I_1$ and $I_2$ are within a range of an expected wetting current level $I_{wet}$ (i.e., the current level expected to be reached with the load control switch 12 closed). The logic controller 20 may be configured to interpret current levels within that range as indicative of the voltage measurement unit 40 and/or some related component of the control circuit 16 falsely indicating switch closure. Alternatively or additionally, the current levels in that range may be considered the result of an internal short. In the example of FIG. 6, however, the logic controller 20 provides an internal short fault if the current level exceeds the current threshold $I_2$.

The diagnostic routine(s) in the open switch testing may also attempt to identify one or more additional fault conditions. In the example of FIG. 6, the logic controller 20 tests for a leakage current fault condition in which current levels fall between threshold current levels $I_2$ and $I_3$ correspond with the leakage current fault condition. The threshold current level $I_3$ corresponds with the maximum current allowed with the load control switch 12 open. Alternatively, a leakage current fault is found when the measured current exceeds the threshold current level $I_3$. The threshold current level $I_3$ may be greater than a valid (or desired) open switch current level $I_{open}$ to account for noise or other factors. The leakage current fault may be indicative of leakage current occurring at some point downstream of the current sensor 36.

The diagnostic routines in the closed switch testing may also involve one or more threshold current levels. The threshold current levels may correspond with the threshold current levels used in connection with the open switch testing. In other cases, one or more different threshold current levels are used. In the example of FIG. 6, the threshold current levels $I_1$ and $I_2$ are used to distinguish between valid closed switch current and two different fault conditions. A low wetting current fault is generated or provided when measured currents fall below the threshold current level $I_2$. A high wetting current fault is generated or provided when measured currents are above the threshold current level $I_1$. The threshold current levels $I_1$ and $I_2$ may thus define a range of acceptable wetting current levels. The threshold current levels may be spaced from the desired or optimal closed switch current level $I_{wet}$ to account for noise or other factors. In other embodiments, the range of acceptable current levels is established by the closed switch current level $I_{wet}$ and an acceptable offset amount.

The control circuit 16 and the logic controller 20 may also be configured to test the voltage measurements apart from the current measurements. In the example of FIG. 1, the control circuit 16 includes a voltage reference source 42 and a switch 44 that selectively couples the voltage reference source 42 to the voltage measurement unit 40. The logic controller 20 may be configured to select a state of the switch 44. In the example of FIG. 1, the switch 44 is controlled with a switch control signal generated by the logic controller 20. During normal operation, the switch 44 is positioned to couple an input terminal of the voltage measurement unit 40 to the pin 32 and, thus, the node 17. During testing, the switch 44 is positioned to couple the input terminal of the voltage measurement unit 40 to the voltage reference source 42.

The voltage measurement testing may include one or more voltage reference levels. For example, the voltage reference source 42 may be configured to generate multiple reference voltages (e.g., 3 and 6 Volts). The logic controller 20 may select one of the reference voltages or otherwise direct the operation of the voltage reference source 42 via a reference control signal, as shown in FIG. 1. The reference voltages may be independently generated from the power source so that any faults in the other components of the control circuit 16 are not introduced into the voltage measurement testing. The reference control signal may specify a reference voltage level from a predetermined set of discrete reference voltage levels or from a continuous range of reference voltage levels.

The logic controller 20 and the detection circuit 22 may be integrated to any desired extent. For example, a comparator and/or other circuitry of the detection circuit 22 may be integrated with the logic controller 20. In some cases, a microcontroller, such as a mixed signal FPGA, may include both an analog-to-digital converter to act as the voltage measurement unit 40 and/or one or more logic blocks to implement the logic functionality of the logic controller 20.

Additional functions may also be provided by the logic controller 20. For example, the control circuit 20 may be configured to select one of multiple levels of the current to be provided to the load control switch 12. The wetting current is provided to the load control switch 12 to burn off the oxidation on the contacts of the load control switch 12. After the wetting current is applied for a period of time, the logic controller 20 may be configured to lower the current level for, e.g., power savings. The lower current level may be associated with, or configured as, a sustaining current, i.e., a current level sufficient to maintain the closed state of the load control switch 12. Multiple sustaining current levels (or other current levels) may be used. Other aspects of the wetting current may be controlled, including, for instance, the duration of application of the wetting current. In other cases, the duration and/or other aspects of the wetting current are determined passively. The term wetting current is used herein to refer to either the current and/or voltage level sufficient to remove the oxidation, but the actual level, duration, and/or other characteristics of the wetting current may vary.

The logic controller 20 may be or include a microcontroller or other controller, or a general microprocessor or an application-specific microprocessor, such as an application-specific integrated circuit (ASIC). In other embodiments, a field-programmable gate array (FPGA) or other controller may be used as the logic controller 20. The logic controller 20 may include one or more processors and one or more memories in which instructions to configure the processor are stored. The instructions are executed by the processor of the logic controller 20 to implement the logic used during the non-diagnostic and diagnostic modes of operation. The logic controller 20 may include any combination of firmware and general-purpose memory to store instructions to be executed during operation.

The configuration of the current source 34 may vary. For example, the current source 34 may be or include various types of pull-up circuitry to support the operation of the load control switch 12. The pull-up circuitry may include a resistor or other circuit between the voltage source V+ and the node 17. In some examples, the pull-up circuitry may be configured as or include a current source or current regulating loop. The resistor or other circuit thus pulls up the voltage level at the node 17 to or toward the power source when the load control switch 12 is open. The pull-up circuitry may include additional circuitry (e.g., one or more active circuits, including one or more transistor devices) to establish multiple levels of current provided via the node 17 to the load control switch 12. The multiple current levels may include a wetting current level (e.g., 15-20 milliamps), and one or more lower current levels (e.g., 1-2 milliamps) sufficient to sustain the closure of the switch. The load control switch 12 may be closed, and a wetting current may be applied for a predetermined time period (e.g., 20 milliseconds). After the predetermined time period, a sustaining current (or sealing current or fret current) may be applied.

Changing from the wetting current to the sustaining current lowers power dissipation, which may be useful in conserving charge stored in the battery. In the example of FIG. 1, the pull-up circuitry is responsive to a current control signal generated by the logic controller 20. The current control signal may be provided to lower the current that flows through the load control switch 12 from the level of the wetting current to the lower level of the sustaining current after operation for a predetermined amount of time at the wetting current level.

FIGS. 2-5 depict various exemplary configurations of the current sensor 36, the current measurement unit 38, and the voltage measurement unit 40. Other configurations may be used. For example, the disclosed embodiments are not limited to the specific sensor-measurement unit pairings shown in FIGS. 2-4. Other pairings may be used, such that a current sensor shown in one figure may be paired with a measurement unit shown in another figure.

FIG. 2 depicts a circuit 50 configured to provide current sensing and current measurement unit. The circuit 50 includes a current sensor 52 and a current measurement unit 54 to generate an output signal indicative of the current flowing through a current source 56. In this example, the sensing element of the current sensor 52 is a diode 58. The diode 58 is disposed in the path along which the wetting current flows to reach the load control switch 12 (FIG. 1). A bipolar transistor 60 of the current measurement unit 54 is connected as a current mirror across the diode 58 in a current mirror arrangement. In this example, the current mirror drives a resistive load 62. A voltage across the resistive load 62 is developed at the collector of the bipolar transistor 60. The current measurement unit 54 further includes a voltage comparator 64 (e.g., an operational amplifier) to compare the voltage across the resistive load 62 with a reference voltage, VT. In this example, the collector is connected to the inverting terminal of an operational amplifier of the voltage comparator 64 to measure the voltage (e.g., through comparison with a reference voltage provided at the non-inverting terminal). The output of the voltage comparator 64 is thus indicative of the current level in the path relative to a reference current level represented by the reference voltage.

FIG. 3 depicts a circuit 70 that includes a resistive current sensor 72 and an inverter-based measurement unit 74. In this example, the current sensor 72 includes a single resistor but other resistor arrangements may be used. The measurement unit 74 includes a field effect transistor (FET) device 76, a digital inverter 78, and a current source 80 as the load. In operation, the current source 56 in the wetting current path causes a voltage drop across the resistive current sensor 72. The voltage drop modifies the extent to which the FET device 76 is activated. If activated enough, the FET device 76 pulls up the voltage at the input terminal of the digital inverter 78 to the power source. The input terminal voltage is then inverted in accordance with the built-in threshold of the digital inverter 78 to produce the output signal. The configuration of the current source 80 may vary, as a variety of active loads may be used.

FIG. 4 depicts a circuit 90 configured to provide current sensing and measurement via a common base amplifier arrangement. In this example, the sensing element is provided by a resistor 92 disposed in the wetting current path with the current source 56. As the current through the resistor 92 increases, the voltage at the emitter of a bipolar transistor 94 drops. Eventually, the bipolar transistor 94 activates, which activates another bipolar transistor 96 having a base terminal in common with the bipolar transistor 94. With a current sensor 98 as an active load, the extent to which the bipolar transistor 96 is activated changes the voltage at the inverting input terminal of an operational amplifier 100. The operational amplifier 98 then compares the voltage with a reference voltage, VT, to generate an output signal indicative of the wetting current level. The configuration of the current source 98 may vary, as a variety of active loads may be used.

FIG. 5 depicts an exemplary voltage measurement circuit 110 having a comparator 112 and reference voltage circuitry 114. A reference voltage (or threshold) is generated by the reference voltage circuitry 114 and provided to one of the input terminals of the comparator 112. A voltage to be measured, such as the voltage at the node 17 (FIG. 1) or a test voltage, is provided to the other input terminal of the comparator 112. In one example, the comparator 112 is or includes an operational amplifier. In such cases, either one of the input terminals may be configured as an inverting input terminal, while the other is configured as a non-inverting input terminal. During operation, the voltage to be measured is compared to the level of the threshold voltage. The logic controller 20 (FIG. 1) is communicatively coupled to an output terminal of the comparator 112 to determine whether to activate the power transistor 18 (FIG. 1) and provide other control signaling (e.g., wetting current diagnostics-related signaling).

The reference voltage may be generated in various ways. The reference voltage circuitry 114 may be coupled to the power source V+ to establish the reference voltage. In some cases, the reference voltage circuitry 114 is or includes a voltage divider arrangement. Other types of circuit arrangements may be used. For example, the threshold circuitry may include one or more active devices.

Other types of voltage measurement circuits may be used. For example, the voltage measurement unit may be or include various types of analog-to-digital converters. In analog-to-digital converter examples, the voltage measurement unit may not include reference voltage circuitry, insofar as the reference voltage is built-in or inherent to the analog-to-digital conversion.

Figure 7:
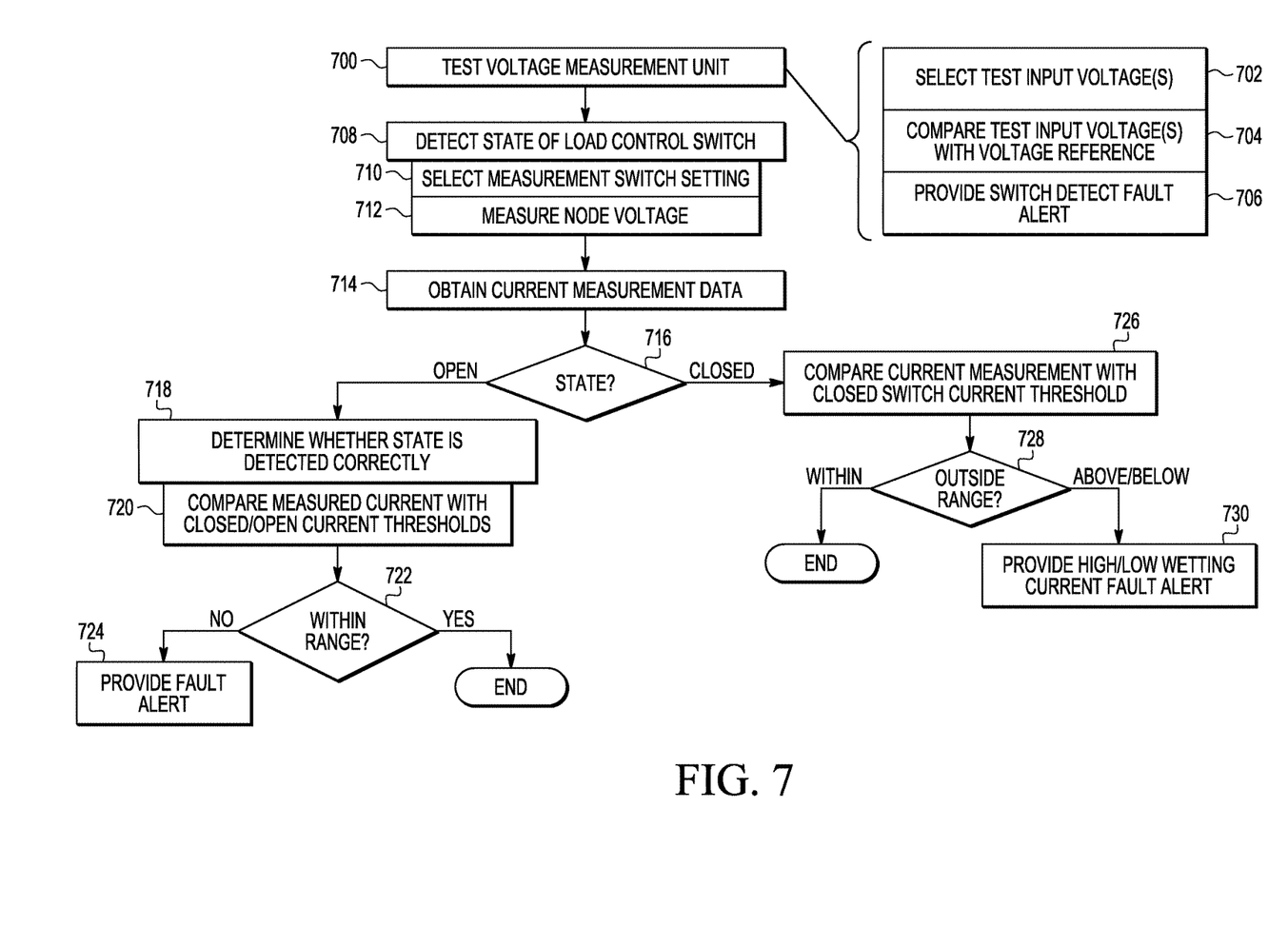
FIG. 7 is a process flow diagram of an exemplary method of wetting current diagnostics testing in accordance with one embodiment.

FIG. 7 shows an exemplary method for wetting current diagnostic testing. The method may be implemented by the control circuits and/or controllers described above. In some cases, another processor or controller may be used to implement the method either in conjunction with the above-described controllers or separately therefrom. The method includes a sequence of acts or steps, only the salient of which are depicted for convenience in illustration. Additional, fewer, or alternative acts may be included. For example, the test sequence may include only testing acts related to current measurement. The ordering of the acts may vary in other embodiments. For example, current measurement data may be obtained before or during the detection of the state of the load control switch. As another example, the test sequence may include conducting closed switch testing before open switch testing, if, for instance, a load control switch is closed at the point at which the method is initiated.

The method is described in connection with a switch to ground load control switch arrangement (e.g., as in the embodiment illustrated in FIG. 1). In the following description, the "node" is an evaluation node, such as the node 17 of FIG. 1. The method may alternatively be applied in connection with a switch to battery arrangement.

The method may be applied to test the wetting current for a normally open load control switch. With the load control switch normally open, oxidation of the switch contacts may occur over time. The contacts of the load control switch may thus benefit from the application of the wetting current each time that the load control switch is closed. The method is directed to testing whether the wetting current is actually provided to the load control switch. Additional aspects of the operation of the wetting current circuitry may also be tested, as described herein.

The method may begin with, or include, an act 700 directed to testing a voltage measurement unit of the control circuit. In the example of FIG. 7, the act 700 includes selecting one or more test input voltages in an act 702, comparing the test input voltage(s) with a voltage reference in an act 704, and generating or otherwise providing a switch detection fault alert in an act 706 if the output of the comparison is incorrect. The test input voltage(s) may be generated by an independent reference voltage source. The selection of the test input voltage(s) may involve controlling an input selection switch as described above. The voltage measurement unit testing may not occur in other embodiments, or may, for instance, be implemented only occasionally (e.g., upon system startup) relative to the other diagnostic testing.

In act 708, a state of the load control switch is detected. The state detection may include selecting a measurement switch setting in an act 710 if, for instance, the operation of the voltage measurement unit was previously tested against one or more test input voltages. The state detection may also include measuring a voltage at the node through which the wetting current passes to the load control switch in an act 712. Such voltage measurement may involve a comparison with a reference voltage (e.g., using a comparator) or a circuit involving an inherent comparison (e.g., using an analog-to-digital converter).

Current measurement data may be obtained in an act 714. The act 714 may occur before, during, or after detection of the state of the load control switch. The act 714 may include measuring a current level of the wetting current using a current sensor and a current measurement unit, as described above.

When the detected state is an open state, control is redirected by a decision block 716 to an act 718, in which the controller attempts to determine whether the voltage measurement unit is operating correctly. The controller may thus determine whether the state of the load control switch is detected correctly. The determination may be based on the measured current level. In this example, the act 718 may include comparing in act 720 the measured current level to one or more current thresholds. The current thresholds may correspond with the current thresholds described in connection with FIG. 6. In this case, a decision block 722 determines whether the measured current is within a desired range, such as below the current threshold $I_3$ (FIG. 6). If the measured current is within the desired range (i.e., below the current threshold $I_3$), then the procedure may end. Otherwise, control passes to an act 724, in which a fault alert is provided. The fault condition may depend on the measured current level, as described above. For instance, if the measured current is below the current threshold $I_1$, then an internal short fault alert may be provided. If the measured current falls between the current thresholds I1 and I2, then a switch detection fault alert may be provided. If the measured current falls between the current thresholds I2 and I3, then a leakage current fault alert may be provided. Additional, alternative, or fewer fault conditions may be identified. For instance, in some cases, the method may only provide a single leakage current fault alert if the measured current is outside of the desired range.

In other embodiments, some or all of the open switch diagnostic testing is not implemented. For instance, the open switch diagnostic testing may be conducted only periodically or occasionally to save power.

The closed switch diagnostic testing may begin with an act 726, in which the measured current is compared with one or more closed switch current thresholds. A decision block 728 may then determine whether the measured current is outside of an acceptable range of current levels. The acceptable range may be defined by upper and lower threshold current levels, such as the levels $I_1$ and $I_2$ (FIG. 6). In the example of FIG. 7, if the measured current falls within the acceptable range, then the wetting current circuitry is operating properly, and the method may restart or terminate. Otherwise, a wetting current fault notification is provided in an act 730 when the measured current level falls outside of the range of current levels relative to the closed switch current threshold(s). A high current fault alert may be provided if the measured current exceeds the upper closed switch current threshold. A low current fault alert may be provided if the measured current is below the lower closed switch current threshold.

In a first aspect, a circuit for diagnostic testing regarding wetting current provided to a load control switch includes a current source coupled to a power source and configured to provide the wetting current along a path to the load control switch, a current sensor connected in series with the current source along the path, the current sensor being configured to generate a current sensor signal indicative of a current level along the path, a voltage measurement unit having an input terminal coupled to a node along the path through which the wetting current flows to reach the load control switch, the voltage measurement unit being configured to detect a state of the load control switch based on a voltage at the node, and a controller coupled to the current sensor and the voltage measurement unit, the controller being configured to determine a wetting current diagnostic condition in accordance with the current level and the detected state.

In a second aspect, a circuit for diagnostic testing regarding wetting current provided to a load control switch includes a current source coupled to a power source and configured to provide the wetting current along a path to the load control switch, a current sensor connected in series with the current source along the path, the current sensor being configured to generate a current sensor signal indicative of a current level along the path, a current measurement unit coupled to the current sensor to receive the current sensor signal, the current measurement unit being configured to implement comparisons of the current level with an open switch threshold and a closed switch threshold, a voltage measurement unit having an input terminal coupled to a node along the path through which the wetting current flows to reach the load control switch, the voltage measurement unit being configured to detect a state of the load control switch based on a voltage at the node, and a controller connected to the current measurement unit and the voltage measurement unit, the controller being configured to determine a wetting current diagnostic condition in accordance with the comparisons and the detected state.

In a third aspect, a method of providing wetting current diagnostics for a load control switch includes detecting a state of the load control switch, and measuring a current level of a wetting current. When the detected state is an open state, a determination is made, based on the measured current level, whether the state of the load control switch is detected correctly. When the detected state is a closed state, the measured current level is compared to a closed switch current threshold.

Although described in connection with load control switches for use in vehicles, the disclosed embodiments are not limited to any particular type or application of load control switches. The load control switches may be used to control any type of load. The load control switches are thus not limited to motors (AC or DC motors), lamps, or other types of loads commonly present on vehicles. The load control switches are thus also not limited to uses involving 12-Volt batteries or other batteries.

The disclosed embodiments are also compatible with a variety of different load control switch environments. The wetting current diagnostics may be provided regardless of the external resistance and/or capacitance presented by the wiring harness and/or other components or aspects of the system in which the load control switch is disposed. The disclosed embodiments may utilize a voltage threshold established for the comparator of the detection unit to avoid any requirements for customization to a specific switch environment.

Although described in connection with single-pole, single-throw switches, the disclosed embodiments are not limited to any particular type of switch. The number of poles may vary. The number of connection options may also vary. For example, the disclosed embodiments may be configured for use with double-throw or triple-throw switches.

The wetting current diagnostic testing disclosed embodiments may be useful in a wide variety of automotive and industrial switching applications. The diagnostic testing is well-suited for multi-channel systems, such as those presented by automotive applications.

While the wetting current diagnostics are useful for normally open switches, the disclosed embodiments may be used in connection with normally closed switches and/or other types of switches. The extent to which wetting current is useful for the load control switch may vary.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A circuit for diagnostic testing regarding wetting current provided to a load control switch, the circuit comprising:
   a current source coupled to a power source and configured to provide the wetting current along a path to the load control switch;
   a current sensor connected in series with the current source along the path, the current sensor being configured to generate a current sensor signal indicative of a current level along the path;
   a voltage measurement unit having an input terminal coupled to a node along the path through which the wetting current flows to reach the load control switch, the voltage measurement unit being configured to detect a state of the load control switch based on a voltage at the node; and
   a controller coupled to the current sensor and the voltage measurement unit, the controller being configured to determine a wetting current diagnostic condition in accordance with the current level and the detected state of the load control switch;
   wherein:
   the state of the load control switch determines whether power is delivered to a load; and
   the load control switch is not disposed in a current path to the load.

2. The circuit of claim 1, further comprising a current measurement unit coupled to the current sensor to receive the current sensor signal, the current measurement unit being configured to generate an output signal indicative of a comparison of the current level with a threshold current level, wherein the controller is coupled to the current measurement unit and configured to determine the wetting current diagnostic condition based on the output signal.

3. The circuit of claim 2, wherein the controller is configured to correlate operation of the voltage measurement unit and the current measurement unit.

4. The circuit of claim 2, wherein:
   the controller is configured to implement first and second diagnostic routines when the voltage measurement unit detects that the state of the load control switch is open and closed, respectively;
   the first diagnostic routine is configured to determine whether the voltage measurement unit is operating correctly; and
   the second diagnostic routine is configured to compare the current level with the threshold current level.

5. The circuit of claim 1, wherein the controller is configured to provide a low current alert if the current level falls below a current range, and to provide a high current alert if the current level is above the range.

6. The circuit of claim 1, wherein the controller is configured to, while receiving an indication of an open state of the load control switch, provide a switch detection fault alert if the current level is within a range of current levels expected to be reached with the load control switch closed.

7. The circuit of claim 1, wherein the controller is configured to:
   if the current level is above an open threshold current level with the load control switch in an open position, deactivate the current source to determine a voltage level at the node with the current source deactivated;
   generate a voltage offset fault alert if the voltage level remains above a threshold voltage level upon deactivation; and
   generate a leakage fault alert if the voltage level falls below the threshold voltage level upon deactivation.

8. The circuit of claim 1, further comprising a voltage reference source and a switch that couples the input terminal of the voltage measurement unit to either the voltage reference source or the node, wherein the controller is configured to select a state of the switch.

9. A circuit for diagnostic testing regarding wetting current provided to a load control switch, the circuit comprising:
   a current source coupled to a power source and configured to provide the wetting current along a path to the load control switch;
   a current sensor connected in series with the current source along the path, the current sensor being configured to generate a current sensor signal indicative of a current level along the path;

a current measurement unit coupled to the current sensor to receive the current sensor signal, the current measurement unit being configured to implement comparisons of the current level with an open switch threshold and a closed switch threshold;

a voltage measurement unit having an input terminal coupled to a node along the path through which the wetting current flows to reach the load control switch, the voltage measurement unit being configured to detect a state of the load control switch based on a voltage at the node; and a controller connected to the current measurement unit and the voltage measurement unit, the controller being configured to determine a wetting current diagnostic condition in accordance with the comparisons and the detected state;

wherein:

the state of the load control switch determines whether power is delivered to a load; and the load control switch is not disposed in a current path to the load.

10. The circuit of claim 9, wherein:

the controller is configured to implement first and second diagnostic routines when the voltage measurement unit detects that the state of the load control switch is open and closed, respectively;

the first diagnostic routine is configured to detect whether the state of the load control switch is detected correctly based on the comparisons of the current level with the open and closed switch thresholds; and the second diagnostic routine is configured to compare the current level with the closed switch threshold.

11. The circuit of claim 9, wherein:

the current sensor comprises a diode disposed in the path and a current mirror connected across the diode; and the current measurement unit comprises a resistive load driven by the current mirror and further comprises a voltage comparator to compare a voltage across the resistive load with a reference voltage.

12. The circuit of claim 9, wherein the current sensor comprises a resistor disposed in the path and a transistor coupled to the resistor such that a voltage drop across the resistor controls an extent to which the transistor is activated.

13. The circuit of claim 9, wherein the current sensor comprises a common base amplifier circuit.

14. The circuit of claim 9, wherein the current measurement unit comprises an active load.

15. The circuit of claim 1, wherein, during a non-diagnostic mode of operation, the controller activates and deactivates, in accordance with the state of the load control switch, a power transistor to allow current to flow through the load.

16. The circuit of claim 1, wherein the wetting current diagnostic condition is a leakage current fault condition.

17. The circuit of claim 1, wherein the wetting current diagnostic condition is a high wetting current fault condition or a low wetting current fault condition.

* * * * *